United States Patent [19]

Papanicolaou

[11] Patent Number: 4,481,082
[45] Date of Patent: Nov. 6, 1984

[54] METHOD OF MAKING RINGS

[75] Inventor: Nicolas A. Papanicolaou, Silver Spring, Md.

[73] Assignee: Martin Marietta Corporation, Bethesda, Md.

[21] Appl. No.: 440,783

[22] Filed: Nov. 10, 1982

[51] Int. Cl.³ .............................................. C25D 5/34
[52] U.S. Cl. ................................ 204/38 B; 204/25; 29/424; 72/367; 174/137 A
[58] Field of Search ................ 204/25, 9, 38 B, 38 R; 29/423, 424; 72/336, 337, 367; 264/313; 174/137 A; 493/288

[56] References Cited

U.S. PATENT DOCUMENTS

| | | | |
|---|---|---|---|
| 2,499,977 | 11/1945 | Scott | 148/4 |
| 2,898,273 | 8/1959 | LaForge, Jr. et al. | 204/9 |
| 3,247,589 | 4/1966 | Burns | |
| 3,319,318 | 5/1967 | Taimuty | 29/155.5 |
| 3,618,205 | 11/1971 | Barber et al. | 29/599 |
| 3,704,175 | 11/1972 | MacKinney | 204/9 |
| 3,849,878 | 11/1974 | Rudd et al. | 29/610 |
| 3,852,124 | 12/1974 | Fassell | 148/6.15 |
| 3,977,069 | 8/1976 | Domaingue, Jr. | 29/424 |
| 4,285,779 | 8/1981 | Shiga et al. | 204/9 |

Primary Examiner—Brian E. Hearn
Assistant Examiner—Nathan Thane
Attorney, Agent, or Firm—Patrick M. Hogan; Gay Chin

[57] ABSTRACT

A method of making rings which includes the steps of placing tubes into a container, filling the container with a bonding material in liquid form, solidifying the bonding material within the container, slicing the container into wafers and then removing the bonding material from the wafers leaving the rings as a residual product. The wafers can also be metalized in order to metalize the upper and lower faces of the rings embedded therein.

5 Claims, 10 Drawing Figures

METHOD OF MAKING RINGS

BACKGROUND OF THE INVENTION

1. Field of the Invention

This invention relates to methods of making rings and particularly to a new and improved method which is especially beneficial for making small rings.

2. Description of the Prior Art

Miniaturization of electronic devices has brought about a need for components of very small size. One such component often employed in small diode packages is a ring used as an insulator and a support between electrodes in the package. A typical ring might have an outside diameter of only 0.030 inches.

Such small rings can be difficult to make. One currently used method involves cutting the rings individually from small tubes. Each ring is then ground, polished and metalized individually. Because of the small size of the rings, the handling and processing of them using this method is tedious and time consuming resulting in low yields and high production costs. In addition, the thicknesses of the rings may be nonuniform, and, since the sidewalls of the rings are exposed during metalization, metal may be deposited on the sidewalls which is undesirable when the rings function as insulators.

Another approach to making small rings might be to chemically etch them from a plate using photolithographic methods. The lateral etching effect occuring during etching of the interior and exterior surfaces of the sidewalls of the rings, however, would be such that the sidewall, which is very thin to begin with, would probably be dissipated leaving no ring at all.

In view of the above-mentioned problems, it is therefore an object of the present invention to provide a method of making a large number of small rings relatively easily and inexpensively.

Another object of the present invention is to provide a method of making rings having uniform thicknesses.

Yet another object of the present invention is to provide a method of making rings which facilitates the metalizing of only preselected portions of the rings.

SUMMARY OF THE INVENTION

The present invention, in accordance with one form thereof, comprises a method of making rings. The method includes the steps of placing a plurality of tubes into a container, filling the container with a bonding material in liquid form, solidifying the bonding material within the container, slicing the container into a plurality of wafers, and removing the bonding material from the wafers leaving rings as a residual product.

In a particular form of the invention, the wafers can be lapped to reduce their thickness and then polished. If it is desired that the rings have metal around the faces thereof, the wafers can be metalized before the bonding material is removed therefrom.

BRIEF DESCRIPTION OF THE DRAWING

This invention will be better understood from the following description taken in conjunction with the accompanying drawing, wherein.

DESCRIPTION OF THE PREFERRED METHOD

Figure 1:
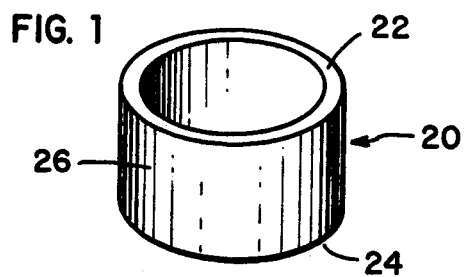
FIG. 1 is a perspective view of a ring made in accordance with the method of the present invention.
Figure 2:
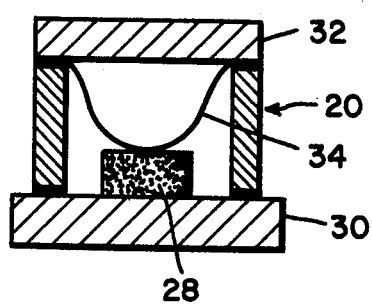
FIG. 2 is a cross-sectional view of the ring employed as an insulator in a diode package.

Turning now to a consideration of the drawing, and in particular to FIG. 1, there is shown a ring 20 made in accordance with the method of the present invention and comprising an upper face 22, a lower face 24 and a sidewall 26. The method of the present invention can be successfully used to make rings 20 of any material and of any size, although the method is particularly beneficial for making small rings. For example, FIG. 2 shows a ring 20 employed as an insulator in a diode package. One surface of a diode 28 is mounted on a metal heat sink 30 and the other surface of the diode is connected to a metal disc 32 by a wire 34. The ring 20 acts as an insulator and mechanical support between the metal heat sink 30 and metal disc 32 and also facilitates the electrical connection between the wire 34 and the metal disc 32 while protecting the diode 28 by sealingly surrounding it. Thus, the ring 20 must be precisely made to predetermined dimensions. The diode package, however, may be very small, the outside diameter of a typical ring measuring only 0.030 inches. The method of the present invention can be employed to make such rings 20 of very small yet precise dimensions.

Figure 3:
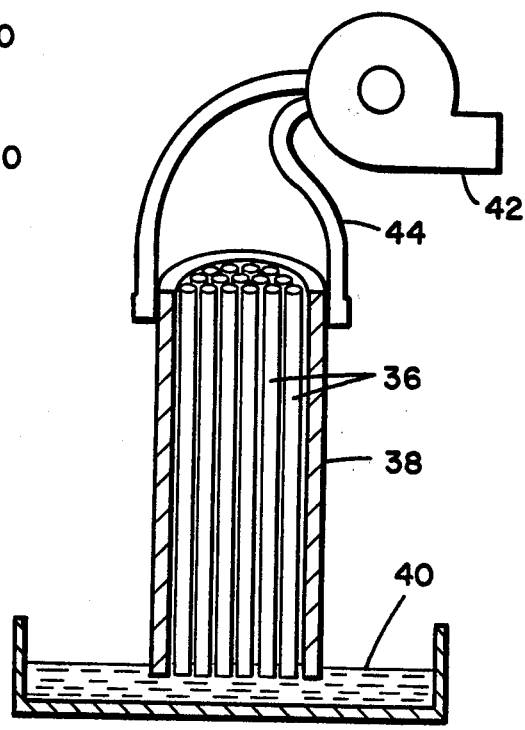
FIG. 3 is a cross-sectional view of a plurality of tubes in a cylinder.

Turning now to FIG. 3, the first step in the method of making the rings 20 is to place a plurality of tubes 36 in parallel alignment into a container adapted to maintain the aligned relationship of the tubes, such as the cylinder 38. The tubes 36 can be wedged lightly if necessary to hold them in place closely adjacent each other. Each of the tubes 36 has the same inside and outside diameters and is made of the same material as one of the rings 20 which is to be made. Although the tubes are shown as having circular cross sections, it is to be understood that the term "tube" is intended to include any other desired cross-sectional shape as well. Correspondingly, the rings made according to the method of the present invention will have the same cross-sectional shape as the tubes. When the rings 20 are to be used as insulators, a suitable material for the tubes 36 and thus the rings 20 might be a ceramic. The cylinder 38 can also be made of any material, but it is preferably made of the same material as the tubes to simplify the cutting, lapping and polishing of later steps.

The next step is to fill the container, or cylinder 38, including the tubes 36 and the spaces between the tubes 36, with a bonding material in liquid form. An example of a suitable bonding material is an epoxy, such as Buehler Epo-mix Epoxide. The bonding material may have to be heated to maintain it in a liquid state. One method of filling the cylinder 38 is to immerse one end of the cylinder in a bath 40 of the liquid bonding material, as is shown in FIG. 3. Capillary action should pull the liquid into the cylinder 38, including into the tubes 36 and the spaces between the tubes due to the sufficiently small diameters of and the sufficiently small spaces between the tubes 36. However, if necessary, vacuum means, such as the vacuum pump 42 and vacuum hose 44, can be connected to the other end of the cylinder 38 to enhance movement of the liquid into the cylinder.

The next step in the method of making the rings 20 is to solidify the bonding material within the container, normally by cooling the material. The cylinder 38 with the tubes 36 embedded in the solidified bonding material within the cylinder can then be easily handled for the subsequent steps.

Figure 4:
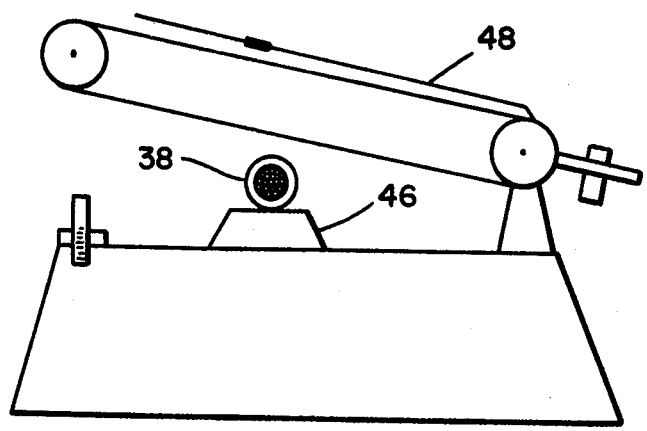
FIG. 4 is a view of the cylinder being sliced into wafers.

Referring to FIG. 4, the next step is to slice the cylinder 38 into a plurality of wafers. An example of a suitable slicing method is to mount the cylinder 38 on a block 46 and slice it with a wafering saw 48. It has been found that when the cylinder 38 and tubes 36 are made of quartz, a diamond blade in the saw 48 is desirable in that it facilitates quick slicing of the cylinder into wafers of substantially uniform thickness.

Figure 5:
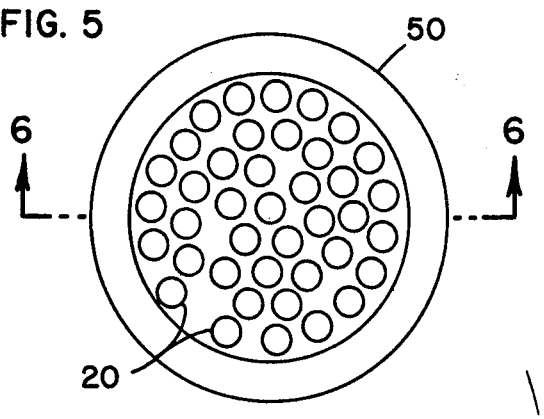
FIG. 5 is a top view of a wafer showing a plurality of rings embedded therein.
Figure 6:
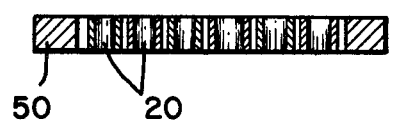
FIG. 6 is a cross-sectional view of the wafer taken along lines 6—6 of FIG. 5.

Turning to FIGS. 5 and 6, a wafer 50 is shown having been sliced from the cylinder 38. The wafer includes embedded therein numerous sections of the tubes 36, which become the rings 20. When the rings 20 are very small for use such as in the diode packages described earlier, a typical thickness for each of the wafers would be 0.008 to 0.010 inches.

Figure 7:
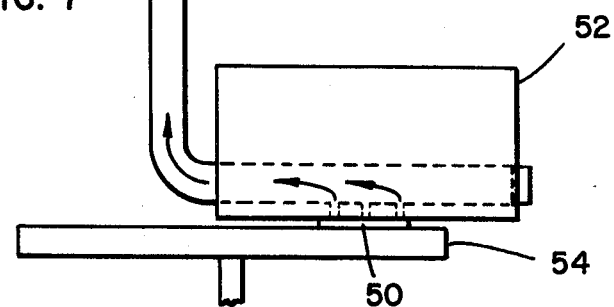
FIG. 7 is a view of the wafer mounted in a vacuum chuck during the lapping and polishing steps.

In order to obtain a precise desired thickness for the rings 20, one or both faces of each wafer 50 are preferably next ground down, or lapped, to a predetermined thickness. The lapping can be done by any suitable method, such as by hand rubbing a glass plate coated with grinding powder against the wafer, or by using some type of mechanical grinding arrangement. An example of a suitable mechanical arrangement is shown in FIG. 7. The wafer 50 is mounted in a vacuum chuck 52, the vacuum permitting secure attachment of the wafer during grinding. The wafer is then lowered against a rotating grinding wheel 54 and lapped to the desired thickness. Thus, all of the rings 20 embedded in each wafer 50 will have uniform thicknesses, an important factor when mass producing items using the rings.

Each of the wafers 50 is next polished on both of its faces until the faces acquire a smooth, mirror-like finish. Preferably, each of the wafers is initially rough polished with a first polishing paste and then smooth polished with a second, less gritty paste. The rough polishing can be by hand while the smooth polishing is preferably achieved using a mechanical polishing arrangement, similar to that shown in FIG. 7, replacing the grinding wheel 54 with a polishing wheel.

The next step in the method of making the rings 20 is to rinse the wafers 50 with at least one cleaning solution in order to remove oil residues from the grinding and polishing pastes. Examples of suitable cleaning solutions are water or methanol.

Figure 8:
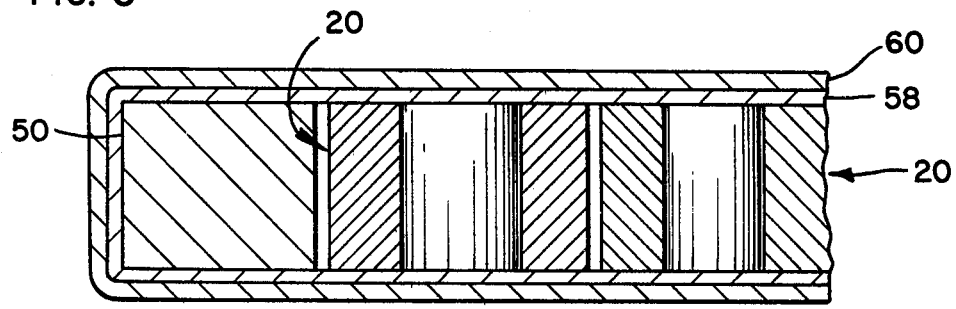
FIG. 8 is an enlarged cross-sectional view of a portion of the wafer after it has been metalized.

If the rings 20 will be required to have metal on the upper and lower faces thereof, as in the example shown in FIG. 2, the next step in the method of making the rings is to metalize both faces of each of the wafers 50, thereby metalizing the upper and lower faces of each of the rings 20 embedded in the wafers. By metalizing the rings while they are embedded the wafer 50, metal will be prevented from being deposited on the sidewall of each ring, an important consideration when the ring is to be used as an insulator. Alternatively, if metalization is not desired, this step can be eliminated. Referring to FIG. 8, which is an enlarged view of a portion of a wafer 50, at least one layer of a metal is deposited on the wafer 50 by any suitable method. One suitable method of metalizing is a sputtering technique, whereby in a vacuum, atoms of a cathode are ejected, or sputtered, from the cathode and deposited upon objects exposed to the sputtering. The choice of which metal or combination of metals to deposit on the wafers 50 will depend upon the uses to which the rings 20 will be put. The metals must also be able to adhere to the rings 20 even in the presence of a solvent, which may be corrosive, as will be discussed in a later step. One combination of metal layers found suitable when the rings 20 are used in diode packages is chromium and platinum. As is seen in FIG. 8, chromium is first deposited on the wafer 50 as an adhesive layer 58. Platinum is then deposited as a second layer 60 over the adhesive layer. If desired, prior to sputtering the chromium and platinum onto the wafers 50, the wafers themselves can be sputtered clean. The chromium and platinum are advantageous in that they provide proper electrical conductivity and bonding properties between the components of the diode package, tend to remain stratified rather than mixing even when they are heated, and also will adhere to the rings even when immersed in certain corrosive solvents, as will be seen in the next step.

Figure 9:
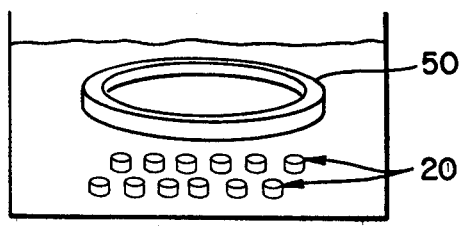
FIG. 9 is a view of the rings having separated from the wafer.

The next step is to remove the bonding material from the wafers 50, thereby leaving the rings 20 as a residual product. One method of removing the bonding material is to liquefy, or dissolve, it by immersing the wafer 50 in an appropriate solvent. For example, if the bonding material were epoxy, an epoxy solvent, such as the commercially available "Depoxy" would be used. As is shown in FIG. 9, when the bonding material dissolves, the rings 20 will separate from the cylinder portion of the wafer 50. The wafer 50 can be vibrated in some manner and the metal coatings thereon can be scratched or scored at locations adjacent the centers of the rings 20 to enhance movement of the solvent 62 into the wafer 50 and also to help break off portions of the metal coatings 58 and 60 from other than around the upper and lower faces of the rings 20. Thus, a large number of the small rings 20 have been relatively easily and inexpensively made from each of the wafers 50.

Figure 10:
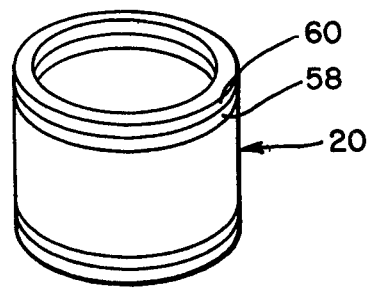
FIG. 10 is a perspective view of one of the rings.

FIG. 10 shows a completed ring including the metal layers 58 and 60 on the upper and lower faces thereof. If there is a need to add additional layers of metal to the rings 20, the layers can be added in an appropriate manner, such as by electroplating the rings using conventional electroplating methods. The plating will occur on the upper and lower faces of the ring which are electrically conductive, since they already have a metallic coating on them. The sidewall of each ring 20 will not be electroplated when it is made of a non-conductive material, such as a ceramic.

It is to be understood that this invention is not limited to the particular form of the method disclosed and it is intended to cover all modifications of the method coming within the true spirit and scope of this invention as claimed. In particular, although materials and dimensional ranges of typical rings 20 have been mentioned above, they are not intended to be limiting as the rings 20 can be made of many materials and of any desired dimensions.

What is claimed is:

1. A method of making small ceramic rings having electrically insulative sidewalls and electrically conductive upper and lower faces comprising the steps of:
   (a) placing a plurality of electrically insulative ceramic tubes closely adjacent each other into a cylinder, each tube having the same diameter as one of said rings;
   (b) immersing one end of said cylinder in a bath of a bonding material in liquid form, said tubes having diameters sized sufficiently small and the spaces between said tubes being sufficiently small for enabling capillary action to cause said bonding material to fill said tubes and the spaces between said tubes;
   (c) cooling said bonding material until it solidifies within said cylinder;
   (d) slicing said cylinder into a plurality of wafers, each of said wafers having two faces;
   (e) lapping both faces of each of said wafers to reduce the thickness thereof to a predetermined value;
   (f) polishing both faces of each of said wafers;
   (g) rinsing said wafers with at least one cleaning solution;
   (h) metalizing both faces of each of said wafers with at least one layer of an electrically conductive metal coating;
   (i) immersing each of said wafers in a solvent and vibrating said wafers and selectively scoring said metal coatings for thereby dissolving said bonding material in said wafers and removing portions of said metal coatings from other than around said upper and lower faces of said rings thereby leaving as a residual product said rings having electrically insulative ceramic sidewalls and electrically conductive upper and lower faces.

2. The method of claim 1 wherein said step of metalizing said wafers comprises first depositing and an adhesive layer of a metal on said wafer and then depositing a second layer of a metal over said adhesive layer.

3. The method of claim 2 wherein said adhesive layer of a metal comprises chromium and said second layer of a metal comprises platinum.

4. The method of claim 1 comprising an additional step after step (h) of electroplating both faces of each of said rings with another layer of a metal.

5. The method of claim 1 comprising connecting the other end of said cylinder in step (b) to vacuum means for enhancing movement of said bonding material into said tubes and the spaces between said tubes.

* * * * *